United States Patent [19]
Kressel et al.

[11] 3,974,514
[45] Aug. 10, 1976

[54] ELECTROLUMINESCENT EDGE-EMITTING DIODE COMPRISING A LIGHT REFLECTOR IN A GROOVE

[75] Inventors: Henry Kressel, Elizabeth; Michael Ettenberg, Freehold; Ivan Ladany, Stockton, all of N.J.

[73] Assignee: RCA Corporation, New York, N.Y.

[22] Filed: Dec. 11, 1974

[21] Appl. No.: 531,614

[52] U.S. Cl. .................................. 357/17; 357/55
[51] Int. Cl.² ................... H01L 33/00; H01L 29/06
[58] Field of Search ................... 357/17, 18, 55, 67

[56] References Cited
UNITED STATES PATENTS

| | | | |
|---|---|---|---|
| 3,341,937 | 9/1967 | Dill | 357/18 |
| 3,534,179 | 10/1970 | Vitkus | 357/17 |
| 3,790,902 | 2/1974 | Miller | 357/18 |
| 3,815,045 | 6/1974 | Ito | 331/94.5 H |
| 3,896,473 | 7/1975 | DiLorenzo et al. | 357/18 |

OTHER PUBLICATIONS

F. Nicoll "Mirrors for Semiconductor Injection Lasers," RCA Technical Note No. 765 (Apr. 1968) 4 pp.

J. Feeley et al., "Process for Forming Chrome–Gold Contacts," IBM Technical Disclosure Bulletin vol. 16 (Apr. 1974) p. 3670.

*Primary Examiner*—William D. Larkins
*Assistant Examiner*—Gene M. Munson
*Attorney, Agent, or Firm*—Glenn H. Bruestle; Donald S. Cohen; Daniel N. Calder

[57] ABSTRACT

A body of semiconductor material having a very limited contact region. The contact region is adjacent an emitting surface of the body, is spaced from the sides of the body and extends no more than one-quarter the distance from the emitting surface to a surface opposite the emitting surface. That portion of the body in the vicinity of the contact region is the active region of the diode. The smaller the active region, relative to the total size of the body, the less the internal absorption of generated light in the body. A groove can be provided across the body adjacent to that end of the contact region opposite from the emitting surface. In the groove is a metallic layer which functions as a light reflector. Any light generated in the body striking the metallic surface may be reflected out to the emitting surface of the body.

5 Claims, 4 Drawing Figures

ELECTROLUMINESCENT EDGE-EMITTING DIODE COMPRISING A LIGHT REFLECTOR IN A GROOVE

The invention disclosed herein was made in the course of, or under, a contract or subcontract thereunder with the Department of the Navy.

BACKGROUND OF THE INVENTION

The invention relates to electroluminescent diodes and more specifically to electroluminescent edge-emitting diodes having low internal absorption to generated light.

Luminescence from an electroluminescent diode is the emission of optical radiation—ultraviolet, visible, or infrared—that is a direct result of the energy released during electronic transitions within a semiconductor material. The luminescence arises from a two-step process in which electrons and holes are generated in concentrations greater than those statistically permitted at thermal equilibrium and then a significant fraction of these carriers recombine. Radiative recombination occurs when the energy of the recombining holes and electrons generates photons.

An electroluminescent edge-emitting diode is one in which the generated light is emitted from only one surface having partial directionality. In the past, electroluminescent edge-emitting diodes have been less efficient as a result of a large portion of the generated light being internally absorbed by the diode and never radiating from the emitting surface. When speaking of efficiency, we are concerned with the quantum efficiency of an electroluminescent diode, which simply is the ratio of photons produced to the number of electrons passing through the diode. The internal quantum efficiency is evaluated at the P-N junction whereas the external quantum efficiency is evaluated at the exterior of the diode. The external quantum efficiency is always less than the internal quantum efficiency as a result of optical losses that occur in extracting the emitted radiation from the diode, one cause of which is internal absorption. Thus, it would be most desirable in the field of electroluminescent edge-emitting diodes to have a diode in which the effect of internal absorption is maintained.

SUMMARY OF THE INVENTION

An electroluminescent edge-emitting diode including a body of semiconductor material having a P-N junction, light-emitting surface substantially perpendicular to the P-N junction, a surface opposite the emitting surface, a contacting surface parallel to the P-N junction, and two sides which are substantially parallel to each other and substantially perpendicular to the P-N junction and emitting surface. A single metal contact is on a portion of the contacting surface spaced from the sides and adjacent the emitting surface. The metal contact extends from the emitting surface a distance no more than one-quarter the distance from the emitting surface to the opposite surface. A groove can be provided across the body and adjacent to the end of the metal contact opposite from the emitting surface.

DETAILED DESCRIPTION OF THE INVENTION

Figure 1:
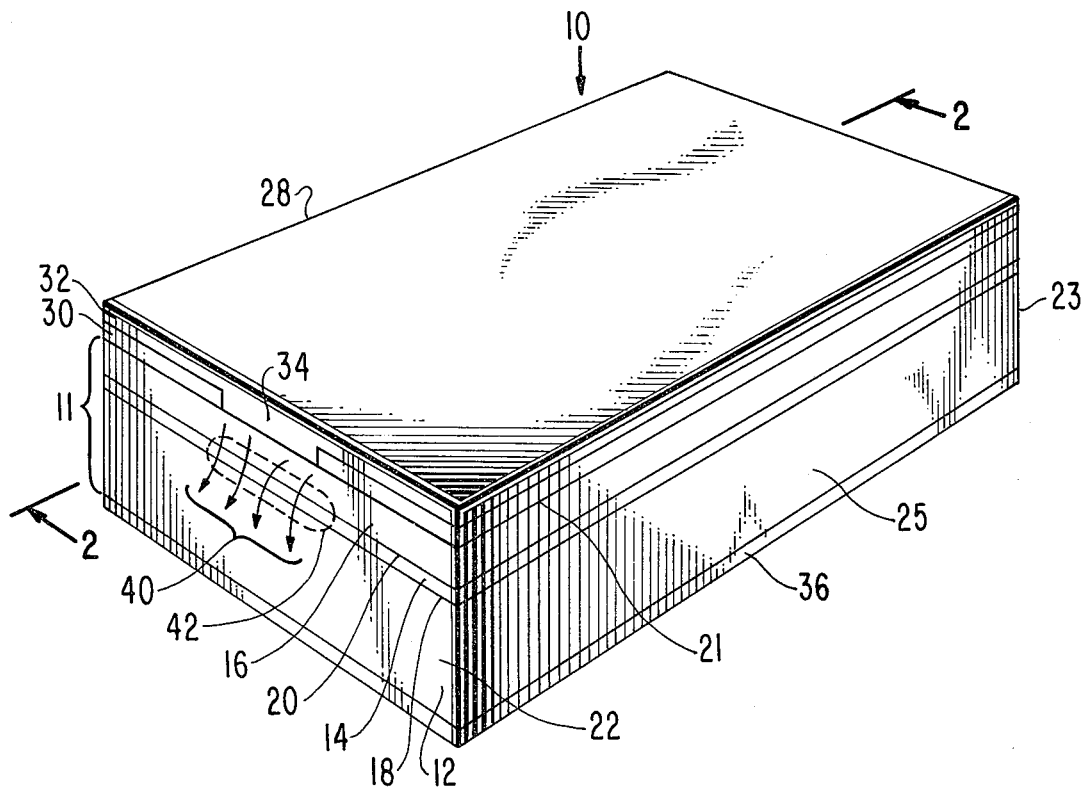
FIG. 1 is a perspective view of a first embodiment of the edge-emitting diode of the present invention.
Figure 2:
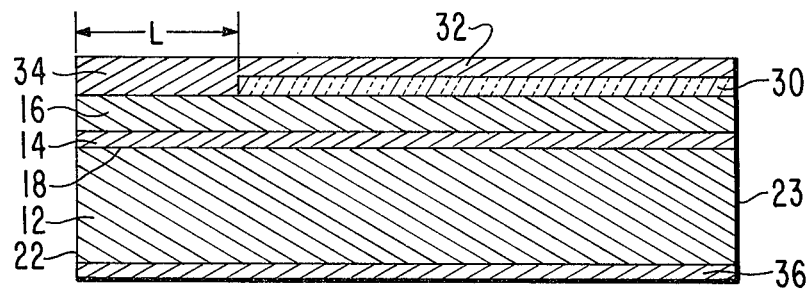
FIG. 2 is a cross-sectional view along line 2—2 of FIG. 1.

Referring to FIGS. 1 and 2, a first embodiment of an electroluminescent edge-emitting diode having the effect of internal absorption minimized, is designated as 10. The electroluminescent edge-emitting diode 10 includes a body 11 of semiconductor material having three consecutive and contiguous regions 12, 14 and 16. A first region 12 is of n-type conductivity and is in intimate contact with a second region 14 of p-type conductivity at a surface of the first region 12, forming a P-N junction 18 therebetween. On a surface of the second region 14, opposite the first region 12, is a third region 16. The third region 16 is of p-type conductivity, and a boundary 20 is between the third region 16 and the second region 14. A contacting surface 21 of the third region 16 is opposite the boundary 20. One edge of the semiconductor body having a plane substantially perpendicular to the P-N junction 18 is the light-emitting surface 22. From the emitting surface 22 radiates the incoherent light generated within the diode 10. Substantially perpendicular to both the plane of the P-N junction 18 and the emitting surface 22 are a first side 25 and a second side 28 of the body 11. The first and second sides, 25 and 28, are approximately parallel to each other. A continuous insulating layer 30 is on the contact surface 21 of the third region 16, except for a small area at the emitting surface 22. The area of the contact surface 21, on which there is no insulating layer 30, does not extend to the first and second sides 25 and 28. The area does extend from the emitting surface 22 toward a surface 23 of the body 11 opposite the emitting surface 22, for a distance L, referring to FIG. 2. The insulating layer 30 is typically of a material such as silicon oxide. On the insulating layer 30 and on that area of the contacting surface 21 not covered by the insulating layer 30 is a first metallic layer 32. That portion of the first metallic layer 32, which is on the contact surface 21 of the third region 16, is designated as a metal contact 34. The metal contact 34 extends from the emitting surface 22 a distance L toward the opposite surface 23 which is typically no more than one-quarter the length of the diode 10, and does not extend to the first and second sides 25 and 28. A second metallic layer 36 is on a surface of the first region 12 opposite the P-N junction 18. The first and second metallic layers, 32 and 36, are typically of a metal having good light reflecting properties such as gold with a layer of a good metallic wetting agent, such as chromium, between the gold and the insulating layer 30 and the first and third regions 12 and 16, to assure adherence of the gold.

In the operation of the electroluminescent edge-emitting diode 10, a forward bias voltage potential is applied between the first metallic layer 32 and the second metallic layer 36. A forward bias voltage on the electroluminescent edge-emitting diode 10 means a positive potential is applied to the first metallic layer 32 and a negative potential is applied to the second metallic layer 36. The first metallic layer 32 is insulated from the semiconductor body 11 by the insulating layer 30, except for the metal contact 34 which is on a portion of the third region 16. Thus, when the diode 10 is forward biased, a current flows from the general area of the metal contact 34 and fans out as it flows through the semiconductor body 11, in the direction of the second metallic layer 36, as indicated by the arrows 40.

When the diode 10 is zero-biased, the P-N junction 18 is in thermal equilibrium, a built-in potential barrier prevents the large concentration of mobile conduction-band electrons on the n-type side of the P-N junction 18, which is the first region 12, from diffusing into the p-type side of the junction 18, which is the second region 14. Similarly, the holes in the valence band are prevented from diffusing from the p-type side to the n-type side of the P-N junction 18. Under forward bias voltage conditions, the potential barrier is reduced. Some of the conduction-band electrons on the n-type side and some of the valence-band holes of the p-type side are thereby allowed to diffuse across the P-N junction 18. Once across the P-N junction 18, the holes increase the minority carrier population on the n-type side and the electrons increase the minority carrier population on the p-type side. The majority carriers on the p-type side are holes, while the majority carriers on the n-type side are electrons. The minority and majority carriers on both sides of the P-N junction 18 recombine and it is this recombination of the minority carriers within a diffusion length of the P-N junction 18 which is the mechanism by which the optical radiation, in other words electroluminescence, is generated. Because the current flow, indicated by the arrows 40, fans out from the metal contact 34, the current flows through only a portion of the P-N junction 18. It is in the general area of this portion of the P-N junction 18 at which there is recombination of minority and majority carriers and the subsequent generation of light. As a result of light being generated in only a portion of the P-N junction 18, the light radiating from the emitting surface 22 is likewise emitted from a limited area of the emitting surface 22 adjacent to that portion of the P-N junction 18 at which light is generated, designated by the elliptical circle 42.

As was previously mentioned, the metal contact 34 is no greater than one-quarter the length of the total diode 10. Generally, the diode 10 will be approximately 400 microns square so the distance L is approximately 100 microns in length. As can be concluded from the description of diode 10's operation, only that portion of the diode 10 in the vicinity of metal contact 34 and through which the current flows, as shown by arrows 40, is the active region of the diode 10. Since the metal contact extends no more than one-quarter the length of the diode 10, only a relatively small area of the diode 10 is the active region. That portion of diode 10 which is not the active region functions as a heat sink for the active region. Since the active region of diode 10 is the region wherein light is generated and this region is both small and adjacent the emitting surface 22, the internal absorption of the diode 10 is minimized. Generally, compared to an electroluminescent diode of the same size and operating voltage but with a larger portion of the diode functioning as the active region, diode 10 has less internal absorption of generated light and thus a high power efficiency.

In the fabrication of the electroluminescent edge-emitting diode 10, the semiconductor body 11 with its three regions 12, 14 and 16 may be made by state of the art liquid phase epitaxy techniues such as those disclosed in U.S. Pat. No. 3,565,702 by H. Nelson, issued Feb. 23, 1971. Next, an insulation layer is evaporated on a surface of the body 11. The surface of the insulation layer is then covered by a photoresist material, which, when exposed to ultraviolet light, is rendered insoluble. Then, the photoresist material is illuminated through a photographic mask so that all the material, except where metal contact 34 is to be formed, is exposed to the ultraviolet light. The photoresist material is then developed and the photoresist material on the unexposed surface of the insulating layer is washed away with a solvent. Next, the insulating layer not covered by the photoresist is dissolved out by immersion in a hydrofluoric acid solution, the photoresist is protecting the remainder of the insulating layer. The photoresist is then removed and a first metallic layer is evaporated onto the insulating layer 30 and that portion of the semiconductor body 11 exposed as a result of the previous photoresist step. Thus, the first metallic layer 32 and metal contact 34 are formed. A metal layer is also evaporated onto the surface of the body opposite the first metallic layer 32, to form the second metallic layer 36. The completion of the electroluminescent edge-emitting diode 10's fabrication is by cleaning and polishing of the surfaces.

Figure 3:
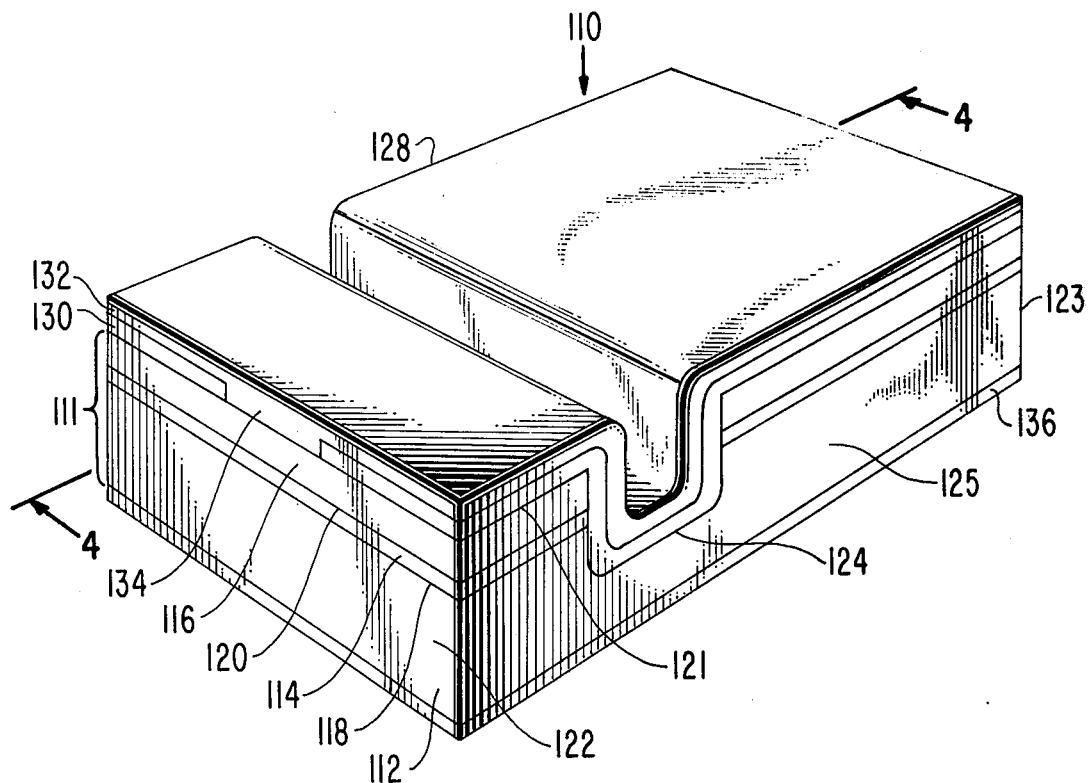
FIG. 3 is a perspective view of a second embodiment of the edge-emitting diode of the present invention.
Figure 4:
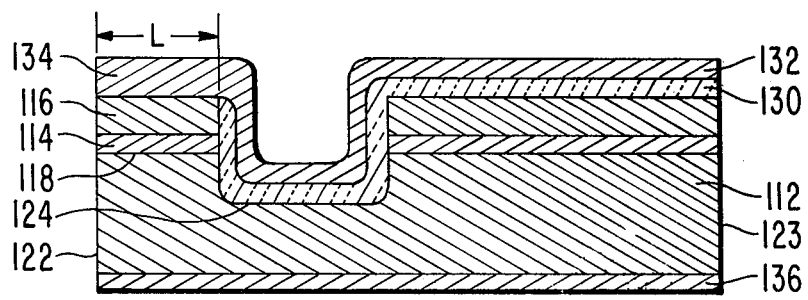
FIG. 4 is a cross-sectional view along line 4—4 of FIG. 3.

Referring to FIGS. 3 and 4, a second embodiment of an electroluminescent edge-emitting diode having the effect of internal abosrption minimized is designated as 110. The electroluminescent edge-emitting diode 110 includes a body of semiconductor material 111 having three consecutive and contiguous region, designated as a first region 112, a second region 114 and a third region 116. Between the first and second regions 112 and 114 is a P-N junction 118, and between the second and third regions 114 and 116 is a boundary 120. A contacting surface 121 of the third region 116 is opposite the boundary 120. One edge of the semiconductor body having a plane perpendicular to the P-N junction 118 is the light-emitting surface 122. A surface of the body 111 opposite the emitting surface 122 is the opposite surface 123. Substantially perpendicular to both the plane of the P-N junction 118 and the emitting surface 122 are a first side 125 and a second side 128 of the body 111. The first region 112, along with the P-N junction 118, boundary 120, contacting surface 121, emitting surface 122 opposite surface 123, first side 125 and second side 128 of diode 110 are the same as the first conductivity layer 12, P-N junction 18, boundary 20, contacting surface 21, emitting surface 22 opposite surface 23, first side 25 and second side 128 of the first embodiment of the present invention, diode 10, respectively.

A groove 124 is in the body 111 at the contacting surface 121. The groove 124 is substantially parallel to the emitting surface 122 and spaced from the emitting surface a distance L. The groove 124 extends through the second and third regions 114 and 116 and across the P-N junction 118, so that each is divided into two distinct and spaced segments. While regions 114 and 116 are of the same material and same conductivity as the regions 14 and 16 of diode 10, they do differ in that regions 114 and 116 have two distinct segments as a result of the groove 124. A continuous insulating layer 130 is in the groove 124 and on the contacting surface 121 of the third conductivity layer 115, except for a portion of the contacting surface 121 spaced from the first and second sides 125 and 128 and extending from the emitting surface 122 to the groove 124, a distance L, referring to FIG. 4. The insulating layer 130, like insulating layer 30 of diode 10, is typically of a material such as a silicon oxide. On the insulating layer 130 and on that portion of the contacting surface 121 not covered by the insulating layer 130 is a first metallic layer 132. That portion of the first metallic layer 132 extending from the emitting surface 122 to the groove 124 and in contact with the third region 116 is designated as metal contact 134. Like the metal contact 34 of diode 10, the metal contact 134 extends a distance L from the emitting surface 122 toward the opposite surface 123, but at the end of the metal contact 134 closest to the opposite surface 123 is a surface of the groove 124. Typically, the metal contact 134 is no more than one-quarter the length of the entire diode 110. A second metallic layer 136 is on the surface of the first region 112 opposite the P-N junction 118. The first and second metallic layers, 132 and 136, are of the same material as the first and second metallic layers, 32 and 36, of diode 10.

Basically, the operation of the electroluminescent edge-emitting diode 110 is the same as that for diode 10, when a forward bias voltage potential is applied between the first and second metallic layers 132 and 136. Like diode 10, the electroluminescent edge-emitting diode 110 has a high power efficiency due to a low internal absorption of generated light. The low internal absorption is due to the fact that the active region, which is in the vicinity of the current flow between the metal contact 134 and the second metallic layer 136, is only a small portion of the entire diode 110. That portion of the diode 110 which is not the active region, functions as a heat sink for the active region. In addition to having a low internal absorption of light, there is in diode 110 a better probability for generated light, which is traveling in the direction opposite to that of the emitting surface 122, to be reflected back into the direction of emitting surface 122. This is due to the first metallic layer 132 in the groove 124 which acts as a reflector to light striking it. Since the length of the active region, L, is small, approximately 100 microns, the path length for the reflected light to the emitting surface 122 is a short distance making more probable emission of the reflected light from the emitting surface 122. Since the purpose of the first metallic layer 132 is to reflect light from the P-N junction 118, it should extend into the groove 124 approximately across the P-N junction 118.

The fabrication of the electroluminescent edge-emitting diode 110 is similar to that of diode 10 with the exception that a groove is cut or etched into a surface of the semiconductor body prior to the forming of the insulating layer 130 and first and second metallic layers 132 and 136.

While the first and second embodiments of the present invention were described as having an N-P-P structure, it is anticipated that the diodes 10 and 110 can also be of an N-N-P structure. The second embodiment of the present invention utilizes a metallic layer in the groove for light reflection, but the present invention also anticipates the use of a groove having a smooth etched surface, adjacent the metal contact 134, for light reflection.

The electroluminescent edge-emitting diodes 10 and 110 of the present invention have several advantages. Since only a small portion of the diodes 10 and 110 are used as the active region, they have a higher power efficiency. To fabricate a diode the size of the active region of the diode of the present invention would be difficult because it would be difficult to handle, cleave and heat sink a diode of such a small size. The diodes 10 and 110 have the advantage of having a heat sink as part of the diode's structure.

In addition, the second embodiment of the present invention, diode 110 has the advantage over the prior art of increased light emission due to the first metallic layer 132 in groove 124 functioning as a light reflector. The edge-emitting diodes of the present invention can be used in optical communications or as a high radiance source.

We claim:

1. An electroluminescent edge-emitting diode comprising:

a body of semiconductor material having a P-N junction, a light-emitting surface substantially perpendicular to the P-N junction, a surface opposite the emitting surface, a contacting surface parallel to the P-N junction, two sides which are substantially parallel to each other, substantially perpendicular to the P-N junction and emitting surface;

a single metal contact on a portion of the contacting surface spaced from the sides and adjacent the emitting surface, said contact extending from the emitting surface a distance no more than one-quarter the distance from the emitting surface to the opposite surface;

an insulating layer on the contacting surface except for that portion of the contacting surface on which is the metal contact; and a groove in the contacting surface of the body, said groove extending across the body substantially parallel to the emitting surface and being adjacent the metal contact at a distance from the emitting surface equal to the distance the metal contact extends from the emitting surface, said groove being spaced from the opposite surface, said groove extending into the body a distance so as to cross the P-N junction, and means at a surface of the groove adjacent the metal contact for reflecting light generated in the body toward the emitting surface.

2. The electroluminescent edge-emitting diode in accordance with claim 1 in which the means for reflecting is a smooth surface of the groove adjacent the metal contact.

3. The electroluminescent edge-emitting diode in accordance with claim 1 in which the means for reflecting is said insulating layer in said groove with a metallic layer on said insulating layer, said metallic layer extending across the P-N junction.

4. The electroluminescent edge-emitting diode in accordance with claim 3 in which the metallic layer is of a gold layer with a chromium layer between the gold layer and the groove.

5. The electroluminescent edge-emitting diode in accordance with claim 4 in which the insulating layer is silicon oxide.

* * * * *